United States Patent
Hallquist

(10) Patent No.: US 8,209,157 B2
(45) Date of Patent: Jun. 26, 2012

(54) METHODS AND SYSTEMS FOR SIMULATING BEAM-TO-SURFACE CONTACTS IN FINITE ELEMENT ANALYSIS

(75) Inventor: John O. Hallquist, Livermore, CA (US)

(73) Assignee: Livermore Software Technology Corporation, Livermore, CA (US)

(*) Notice: Subject to any disclaimer, the term of this patent is extended or adjusted under 35 U.S.C. 154(b) by 469 days.

(21) Appl. No.: 12/545,799

(22) Filed: Aug. 21, 2009

(65) Prior Publication Data

US 2010/0286966 A1 Nov. 11, 2010

Related U.S. Application Data

(60) Provisional application No. 61/175,862, filed on May 6, 2009.

(51) Int. Cl.
G06F 17/00 (2006.01)
(52) U.S. Cl. ................... 703/2; 703/6; 703/8
(58) Field of Classification Search ............ 703/2, 6, 703/8
See application file for complete search history.

(56) References Cited

U.S. PATENT DOCUMENTS

| | | | | |
|---|---|---|---|---|
| 5,379,227 A * | 1/1995 | Tang et al. | | 700/98 |
| 5,963,459 A * | 10/1999 | Burnett et al. | | 703/5 |
| 6,064,810 A * | 5/2000 | Raad et al. | | 703/23 |
| 6,714,901 B1 * | 3/2004 | Cotin et al. | | 703/7 |
| 6,873,944 B1 * | 3/2005 | Buttolo et al. | | 703/7 |
| 6,876,956 B1 * | 4/2005 | Cirak et al. | | 703/2 |
| 7,382,367 B1 * | 6/2008 | Lu et al. | | 345/420 |
| 7,467,074 B2 * | 12/2008 | Faruque et al. | | 703/8 |
| 7,640,146 B2 * | 12/2009 | Nutwell et al. | | 703/2 |
| 7,657,408 B2 * | 2/2010 | Ishikawa | | 703/2 |
| 7,657,409 B2 * | 2/2010 | Chow | | 703/2 |
| 7,672,819 B2 * | 3/2010 | Kumagai | | 703/6 |
| 7,702,490 B1 * | 4/2010 | Wu et al. | | 703/2 |
| 7,739,084 B2 * | 6/2010 | Chow | | 703/2 |
| 7,945,432 B2 * | 5/2011 | Hallquist | | 703/8 |
| 7,953,578 B2 * | 5/2011 | Roger et al. | | 703/1 |
| 2002/0045965 A1 * | 4/2002 | Takizawa | | 700/118 |
| 2003/0058259 A1 * | 3/2003 | Kawaguchi et al. | | 345/646 |
| 2003/0149500 A1 * | 8/2003 | Faruque et al. | | 700/97 |

(Continued)

OTHER PUBLICATIONS

European Patent Office: "Invitation pursuant to Rule 63(1) EPC for Application No. 10159103.0-2224", Sep. 7, 2010.

(Continued)

*Primary Examiner* — Kamini S Shah
*Assistant Examiner* — Kibrom Gebresilassie
(74) *Attorney, Agent, or Firm* — Roger H. Chu

(57) ABSTRACT

Methods and systems for simulating beam-to-surface contacts in finite element analysis (FEA) are disclosed. A FEA model contains at least one beam element and at least one surface mesh. Surface mesh comprises a plurality of two-dimensional finite elements having arbitrary mesh density. A minimum characteristic length (CL) of the surface mesh is calculated. One or more interior points are defined for those beam elements with length longer than CL. For every nodal point (i.e., end nodes and interior points if any), a parametric coordinate between 0 and 1 inclusive is established and kept constant throughout the FEA analysis. Distributed nodal masses are used for calculating a stiffness value for calculating nodal force to resist penetration. Initial penetration with the surface mesh at each nodal point along the beam element is compensated with a set of displacements subtracting from the initial nodal displacements, such that the compensational forces remain at zero as the nodal point's initial interpenetration decreases.

15 Claims, 7 Drawing Sheets

U.S. PATENT DOCUMENTS

| | | | | |
|---|---|---|---|---|
| 2003/0229476 | A1* | 12/2003 | Naganarayana et al. | 703/1 |
| 2004/0130878 | A1* | 7/2004 | Sawai et al. | 361/826 |
| 2004/0167752 | A1* | 8/2004 | Sawai | 703/1 |
| 2005/0071091 | A1* | 3/2005 | Dong et al. | 702/42 |
| 2007/0090165 | A1* | 4/2007 | Kumagai | 228/101 |
| 2007/0165948 | A1* | 7/2007 | Laffargue et al. | 382/173 |
| 2007/0233436 | A1* | 10/2007 | Ishikawa | 703/2 |
| 2007/0295700 | A1* | 12/2007 | Nutwell et al. | 219/109 |
| 2009/0259329 | A1* | 10/2009 | Patnala | 700/98 |
| 2010/0094597 | A1* | 4/2010 | Blain et al. | 703/1 |
| 2010/0131256 | A1* | 5/2010 | Hallquist | 703/8 |

OTHER PUBLICATIONS

Applicant's response to the Sep. 7, 2010 EPO Invitation-Oct. 20, 2010.

European Patent Office: Extended Search Report for Application No. 10159103.0-2224/2249266, Jun. 6, 2011.

* cited by examiner

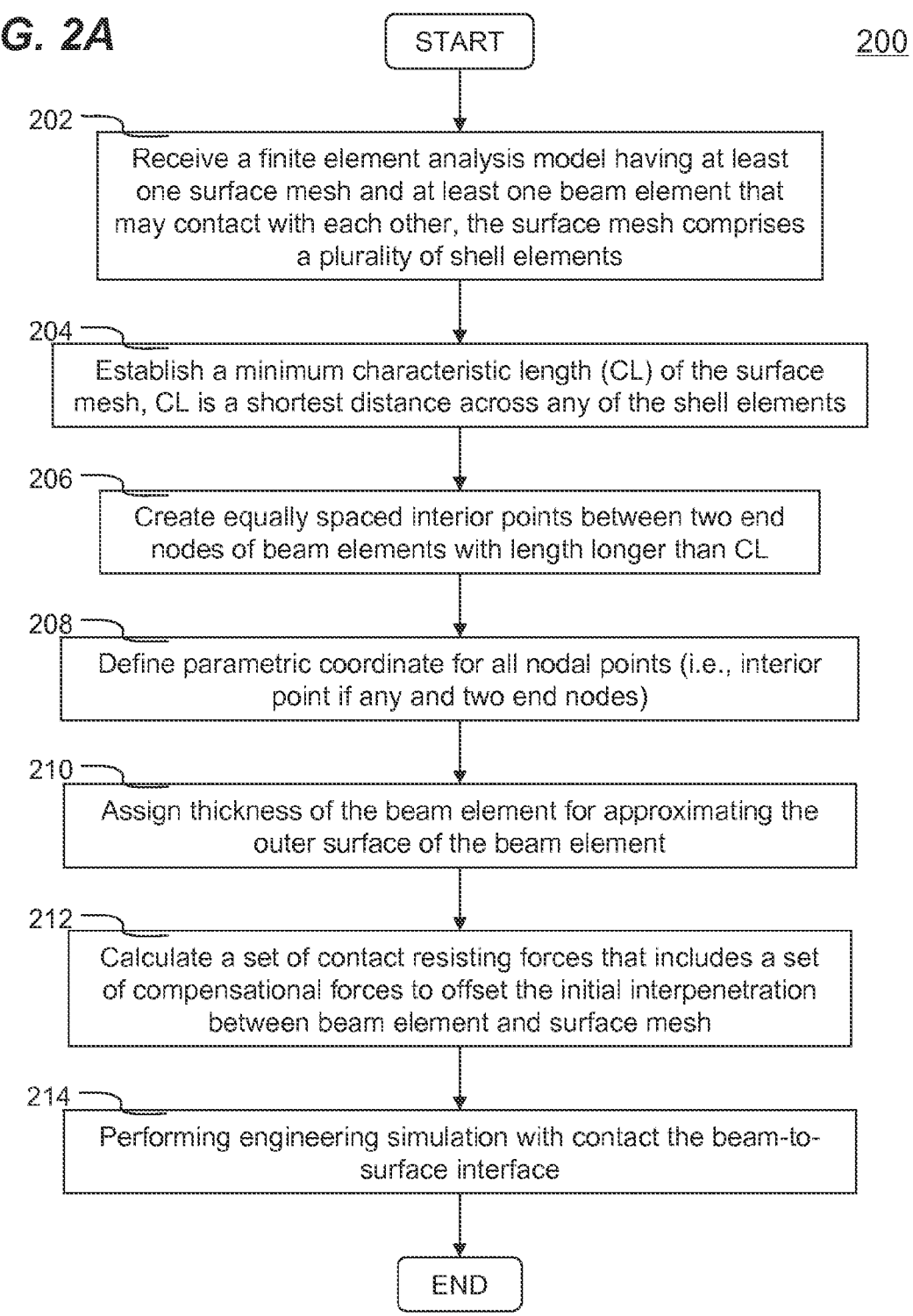

METHODS AND SYSTEMS FOR SIMULATING BEAM-TO-SURFACE CONTACTS IN FINITE ELEMENT ANALYSIS

CROSS-REFERENCE TO RELATED APPLICATION

This application claims priority from a co-pending U.S. Provisional Patent Application Ser. No. 61/175,862 filed May 6, 2009, the entire contents of which are incorporated herein by reference.

FIELD OF THE INVENTION

The present invention generally relates to computer aided engineering analysis, more particularly to improved methods and systems for simulating beam-to-surface contacts in finite element analysis used for a time-marching engineering simulation for assisting users to make decision in improvement of an engineering product (e.g., car, airplane) design.

BACKGROUND OF THE INVENTION

Computer aided engineering (CAE) has been used for supporting engineers in many tasks. For example, in a structure or product design procedure, CAE analysis, in particular finite element analysis (FEA), has often been employed to evaluate responses (e.g., stresses, displacements, etc.) under various loading conditions (e.g., static or dynamic).

FEA is a computerized method widely used in industry to simulate (i.e., model and solve) engineering problems relating to complex products or systems (e.g., cars, airplanes, etc.) such as three-dimensional non-linear structural design and analysis. FEA derives its name from the manner in which the geometry of the object under consideration is specified. The geometry is defined by elements and nodes. There are many types of elements, solid elements for volumes or continua, shell or plate elements for surfaces and beam or truss elements for one-dimensional structure objects. One of the most challenging simulations is related to contacts between two or more locations of the FEA model.

Simulating contacts have been mainly used in an impact event of two objects, for example, automobile crash, sheet metal forming, etc. Most of the prior art approaches have been focused on surface-to-surface contacts because automobiles and/or sheet metals are mainly modeled with shell elements (i.e., surface elements). As the advent of the computer power and technologies, more sophisticated engineering simulations are desired, for example, cables contained within a conduit, cables near a structural surface, human body modeling of muscles and tendons interacting with the skeleton, woven fabrics on a surface, etc. Many of these simulations require beam elements in contact with one or more surface meshes (i.e., a group of shell elements). Prior art approaches to simulate such contacts have been inadequate and inefficient, particularly when the surface mesh contains certain characteristics: for example, different sizes of shell elements, many different curvatures of small radius, arbitrary meshing (continuous or disjoint), and when the beam element's length is much larger than the surface mesh size.

To demonstrate the problems of prior art approaches, two examples are shown in FIGS. 1A and 1B (shown in two-dimension for illustration and visual simplicity). First, a beam element 110 is in contact with a surface 118 is shown in FIG. 1A. Because the beam element 110 is represented by two end nodes 112-114 in the prior art approaches, only two contacts can be detected between the beam element 110 and surface 118. Any contact between interior portion of the beam element 110 and the surface 118 is ignored. To further demonstrate the problem, FIG. 1B shows a beam element 120 is in contact with a surface 128 having many curvatures of small radius. Again only two contacts can be detected between the surface 128 and the beam element 120 at either end nodes 122-124. However, it is clear that there are three contacts between the beam element 120 and the surface 128. It would, therefore, be desirable to have an improved method and system that can be used for simulating beam-to-surface contacts more accurately and efficiently.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Improved methods and systems for simulating beam-to-surface contacts in finite element analysis are disclosed. According to one aspect of the present invention, a finite element analysis model contains at least one beam element and at least one surface mesh that may contact with each other. The surface mesh comprises a plurality of two-dimensional finite elements having arbitrary mesh density (i.e., shell elements with different and/or similar size). A minimum characteristic length (CL) of the surface mesh is calculated. One or more interior points are defined for those beam elements with length longer than CL. For every nodal point (i.e., end nodes and interior points if any), a parametric coordinate between 0 and 1 inclusive is established and kept constant throughout the finite element analysis in a time-marching engineering simulation. Distributed nodal masses are used for calculating a stiffness value for calculating nodal force to resist penetration. Nodal points along the beam element are assigned a beam thickness approximating the outer surface of the beam element. Initial penetration with the surface mesh at each nodal point along the beam element is compensated with a set of forces that are subtracted from the initial nodal resisting force. The set of compensational forces ensures that equilibrium exists at the start of the simulation.

According to another aspect, after beam elements have been initially treated, contacts between each of the nodal points is checked against every shell element of the surface mesh in an intermittent global search scheme. The global search is configured for detecting contacts between the beam element and a surface having disjointed segments and variable curvatures (e.g., curvatures vary arbitrarily).

According to yet another aspect, local search scheme is used for determining whether each of the nodal points are in contact with the surface mesh or not. If so, a set of contact forces is calculated for that nodal point. Otherwise, an estimate based on anticipation of the particular nodal point to be in contact with the surface mesh under current conditions is estimated. The estimate is generally calculated in form of a particular number (N) of time steps or solution cycles. The local search for that nodal point is configured to be skipped for the subsequent (N/2) solution cycles immediately after the estimate or prediction has been made. In the local search, a nodal point is tracked as it moves segment-to-segment so long as the surface is continuous (i.e., not disjointed and nearby).

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIGS. 2A-2B collectively are a flowchart illustrating an exemplary process of simulating beam-to-surface contacts in a finite element analysis, according to an embodiment of the present invention;

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1-6. However, those skilled in the art will readily appreciate that the detailed description given herein with respect to these figures is for explanatory purposes as the invention extends beyond these limited embodiments.

Figure 1A:
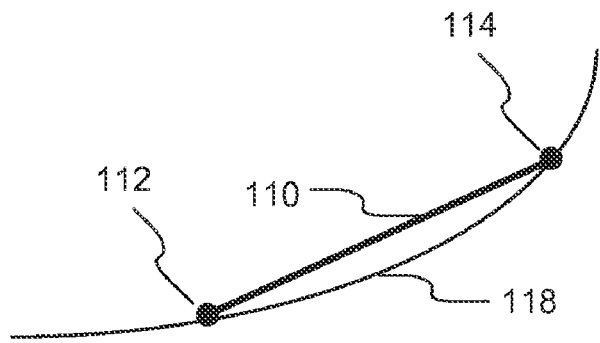
FIGS. 1A-1B are two-dimensional views showing examples of a beam element in contact with a surface mesh.
Figure 1B:
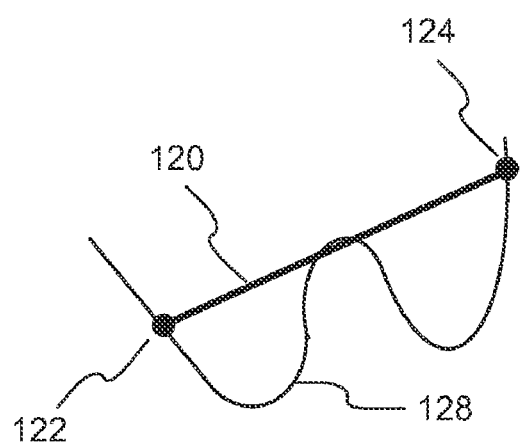
Figure 2B:
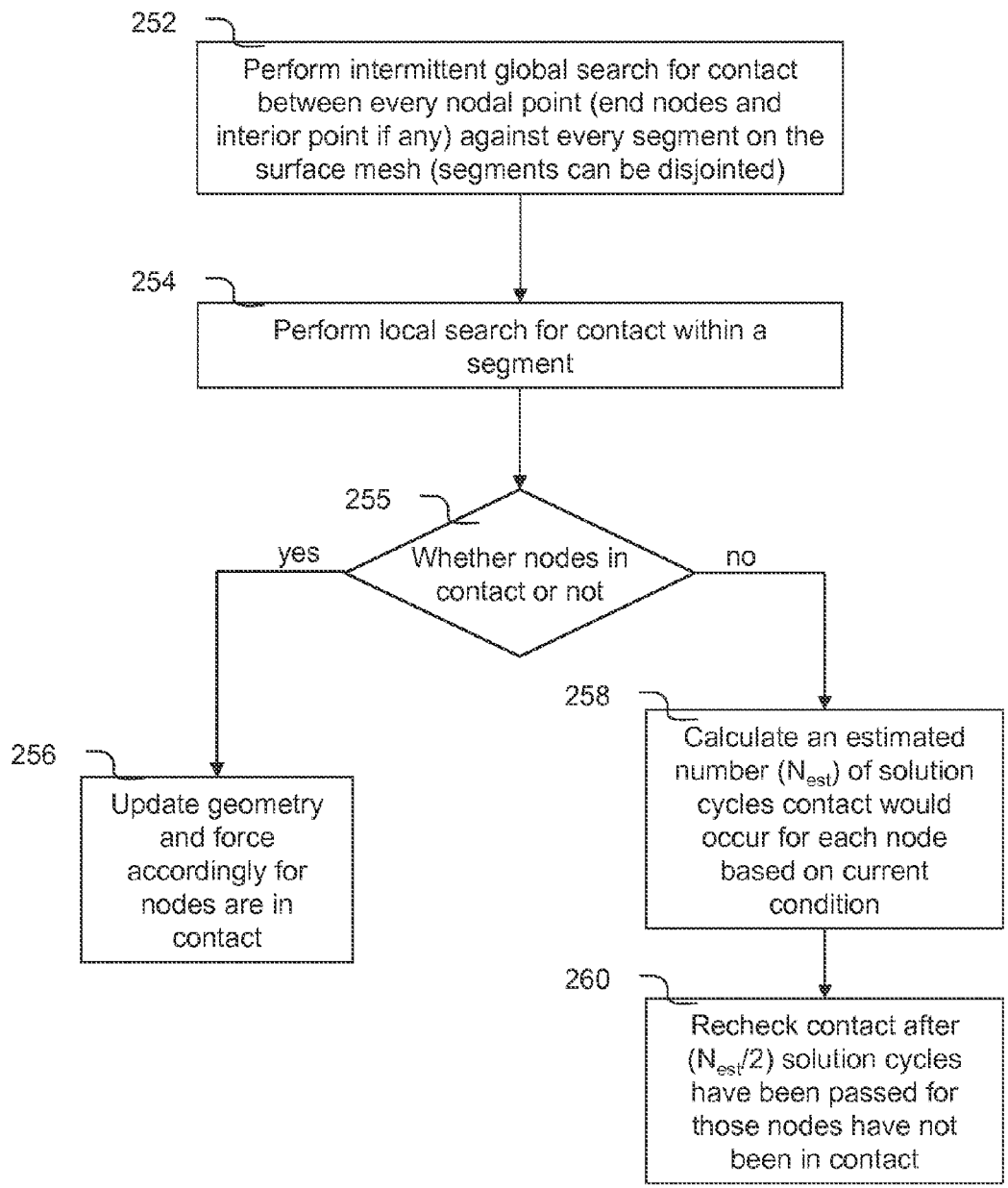

Referring first to FIGS. 2A-B, there are collectively shown a flowchart illustrating an exemplary process 200 of simulating beam-to-surface contacts in finite element analysis, according to an embodiment of the present invention. Process 200 is preferably implemented in software.

Process 200 starts, at step 202, by receiving a finite element analysis (FEA) model that defines an engineering product to be designed or improved, for example, an automobile including crash dummy (i.e., vehicle occupant). A time-marching engineering simulation using FEA is performed to evaluate structural behaviors of the engineering product under a design event (e.g., a car crash). The time-marching simulation comprises a number of time steps or solution cycles.

Figure 3:
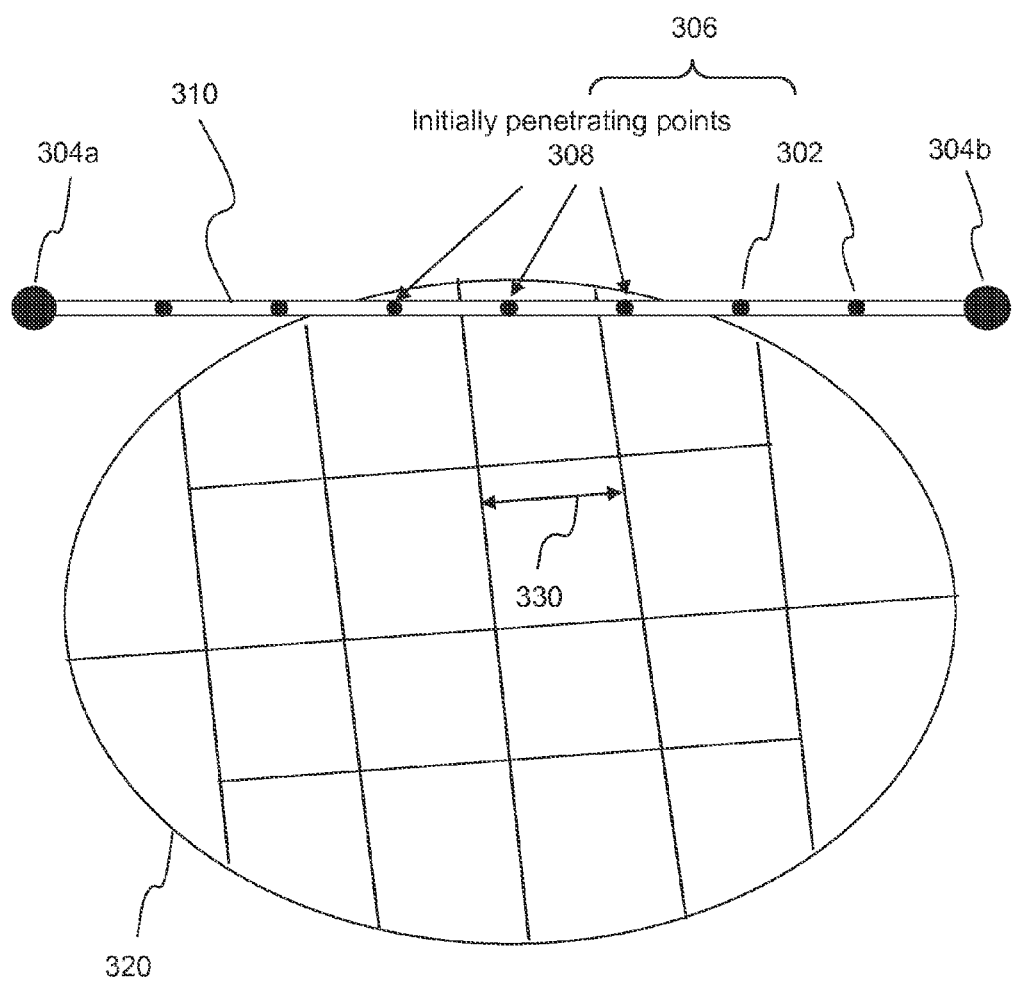
FIG. 3 is a diagram showing an exemplary beam element having a plurality of interior points in contact with a surface mesh, according to an embodiment of the present invention.

The FEA model includes at least one surface mesh and at least one beam element that may be contacted with each other. The surface mesh comprises a plurality of two-dimensional elements (e.g., shell elements). Beam elements may be used for modeling tendons while the surface mesh is for the bones of the crash dummy (e.g., human ribs and tendons). Next, at step 204, a minimum characteristic length (CL) of the surface mesh is established. CL is defined as the smallest distance across an element (e.g., a shell element). The minimum CL is the smallest CL of all of the elements of the surface mesh. Then, at step 206, at least one interior point is generated for those beam elements whose length is longer than CL. The at least one interior point is equally spaced between two end nodes of the beam element. FIG. 3 shows an exemplary beam element 310 and an exemplary surface mesh 320 (not to scale). The beam element has two end nodes 304$a$-$b$. A set of interior points 302 is created for the beam element 310. The surface mesh includes a number of two-dimensional elements. Minimum CL 330 (example only) is shown to demonstrate the concept. Two end nodes 304$a$-$b$ and the interior points 302, 308 of the beam element 310 are collectively referred to as nodal points 306 in this document. Every nodal point 306 of the beam element 310 is used in contact calculations with the surface mesh 320. Initial penetration points 308 are those nodal points having initial interpenetration with the surface mesh 320.

Figure 4:
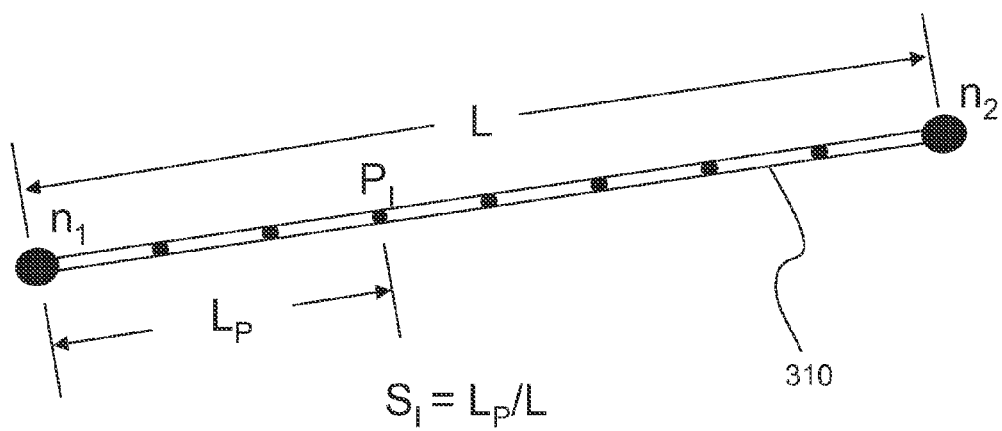
FIG. 4 is a diagram showing an exemplary nodal point of a beam element and its parametric coordinate, according to embodiments of the present invention.

At step 208, each nodal point 306 is assigned a parametric coordinate. FIG. 4 is a diagram showing the definition of an parametric coordinate, $S_I$, of an exemplary interior point $P_I$ as $$S_I = L_P/L$$

where L is the length of the beam element 310, $L_P$ is the distance of interior point $P_I$ measured from the first end node $n_1$. Two end nodes of the beam element 310 are denoted as first end node $n_1$ and second end node $n_2$, respectively. Parametric coordinate of the first end node is 0 (zero), while parametric coordinate of the second end node is 1 (one).

Next, at step 210, thickness of the beam element is optionally assigned to each nodal point 306 along the beam element 310 for approximating the outer skin of the beam element. Contacts between outer skin of the beam element and the surface mesh can then be calculated. Thickness can be a constant for a uniform geometry or a variable value for non-uniform geometry. In one embodiment, thickness at two end nodes can be used for deriving the thickness at each interior point for a tapered geometry. In another embodiment, the exact cross-sectional shape of the beam (e.g., circular, I-shape, U-channel, etc.) can be considered in contact. A circular approximation representing the exact cross-sectional shape is most efficient computationally.

Next, at step 212, a set of contact resisting forces at each nodal point 306 along the beam element. For those nodes 308 having initial interpenetration with the surface mesh 320, a set of compensational forces is calculated to offset the initial interpenetration. The set of compensational forces decreases monotonically to zero as the interpenetration decreases. To calculate contact resisting forces and compensational forces, each nodal point 306 is assigned a stiffness value, K. For example in the explicit time integration scheme, $$K = \alpha M/\Delta t^2$$

where M is nodal mass, α is a user defined constant (e.g., α=0.10) and Δt is the time step size between two solution cycles. The nodal mass M can be calculated as follows: at each interior point 302, 308, $$M_{point} = \rho AL/(n+1)$$

where ρ is density of the beam, A is area of the beam, L is the length of the beam and n is the number of interior points. at each end node 304*a-b*, $$M_{node} = M_{point}/2$$

In the implicit time integration scheme, the nodal stiffness can be calculated as follows: at interior point 302, 308

$$K_{point} = fac(AE)/(L \times (n+1))$$

where fac is a user defined factor (e.g., 0.10), E is Young's modulus, A, L and n are defined above. at each end node 304*a-b*

$$K_{node} = K_{point}/2$$

In the implicit time integration scheme, a time step size $\Delta t_s$ can be specified by a user, which applies to the contact stiffness calculation only. The time step size in the implicit time integration scheme is substantially larger than the required explicit time integration time step size, for example, 100-1000 times larger.

The contact resisting force, F, at a nodal point 306 is calculated using formula F=KΔu, where Δu is the displacement vector giving the interpenetration distance of the nodal point of the beam element through the contact surface (i.e., surface mesh). Shown in FIG. 5A, the node 502 (i.e., a particular nodal point 306) on the beam 510 has an initial interpenetration distance Δu 522*a* with the surface 512. To avoid numerical instability due to a large initial force, a compensational displacement vector is subtracted from the initial interpenetration displacement vector. The resulting contact resisting force is as follows:

$$F = K(\Delta u - \delta u)$$

where δu 524*a* is a compensational displacement vector initially assigned the value of initial interpenetration then decreases monotonically as the nodal penetration decreases.

Figure 5A:
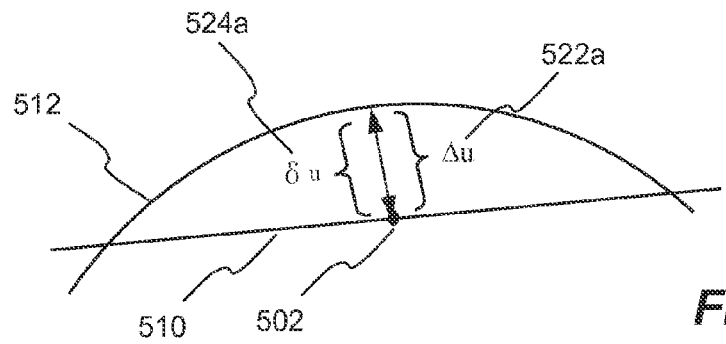
FIGS. 5A-5C are diagrams collectively showing various definitions used for simulating initially penetrating points of an exemplary beam element in a beam-to-surface contact interface, according to an embodiment of the present invention.

FIG. 5A shows an initial configuration of a contact between a beam 510 and a surface mesh 512. Node 502 has an initial penetration vector Δu 522*a* and a compensational displacement vector δu 524*a*. Since these two terms have equal magnitude, the contact resisting force is zero as a result initially.

Figure 5B:
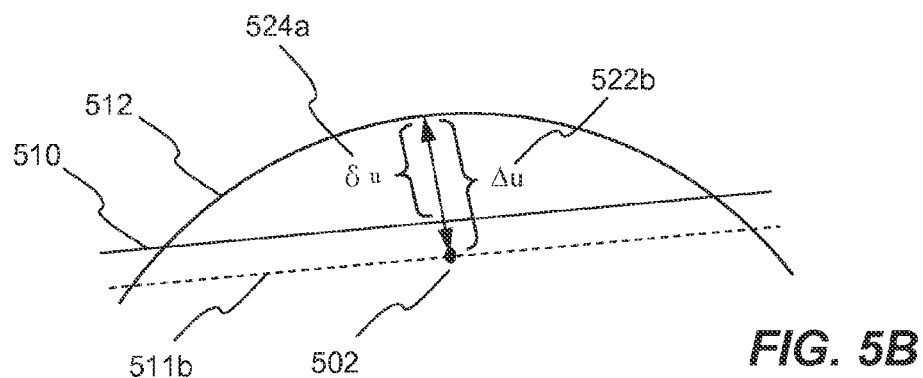

FIG. 5B shows a subsequent configuration in which the beam 510 moves to a new position 511*b* causing more penetration of node 502 with the surface mesh 512. Interpenetration distance vector Δu 522*b* increases accordingly while the compensational displacement vector δu 524*a* stays the same. Therefore, a positive contact resisting force is resulted.

Figure 5C:
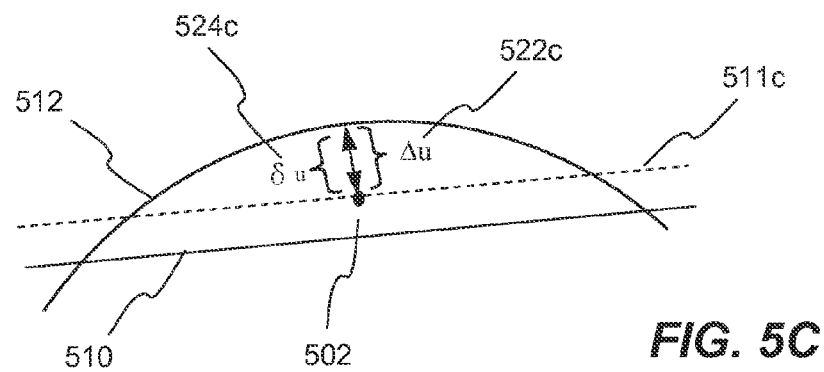

In another scenario (opposite to the one shown in FIG. 5B) shown in FIG. 5C, the beam 510 moves to a new position 511*c* causing less penetration of node 502 with the surface mesh 512. Interpenetration displacement vector Δu 522*c* decreases accordingly while the compensational displacement vector δu 524*c* also decreases in a same amount. As a result, the contact resisting force is zero. In other words, there is no resistance to node 502 when the beam element 510 moves away from the original location.

Referring back to FIG. 2A, at step 214, a time-marching engineering simulation include contact between beam element and surface can be conducted in a finite element analysis, which can be used for assisting users to make decision in improving an engineering product.

An exemplary process 250 of detecting contacts between each nodal point along a beam element and a surface mesh is illustrated in a flowchart in FIG. 2B. Process 250 is preferably implemented in software.

Process 250 starts by performing an intermittent global search between every nodal point 306 against every segment (e.g., every two-dimensional element in the surface mesh) in a predetermined time interval at step 252. The global search is configured to ensure detection of contacts between a beam element and a set of disjointed segments on the surface mesh. It can be implemented using a bucket sorting technique to allow one of the most efficient schemes to locate contacts. For implicit time integration scheme based FEA, global search is conducted every solution cycle or time step due to much larger changes of states. The predetermined time interval can be much larger (e.g., 200 solution cycles) for explicit time integration based FEA due to very small time step increments.

Next, at step 254, a local search is performed to locate an exact location of contact between nodal points and segments. Process 250 moves to decision 255 to first determine whether a nodal point is in contact with a segment. If "yes", process 250 updates geometry and force accordingly at step 256. For example, the nodal point's corresponding parametric coordinates on the segment from previous solution cycle is located. If not on the currently searched segment, adjacent segments are checked for contact. Otherwise if contact on the currently searched segment is confirmed, the following items are calculated: 1) penetration distance (e.g., Δu 522*a*); 2) contact resisting force including compensational force (e.g., F=K (Δu−δu)); 3) frictional forces if Coulomb friction is considered in the simulation; and 4) damping forces if desired. All these calculated forces are added to the global force vector for the next solution cycle.

Referring back to decision 255, if "no", these nodes are close to the segment but not in contact yet. At step 258, an estimated number of time steps or solution cycles ($N_{est}$) that each of the nodes may be in contact with a segment is calculated. Next at step 260, contact between each of the nodes may be in contact and the segment is rechecked after ($N_{est}/2$) time steps or solution cycles. Skipping subsequent ($N_{est}/2$) solution cycles immediately after an estimate has been made ensures efficient and effective contact detection.

Figure 6:
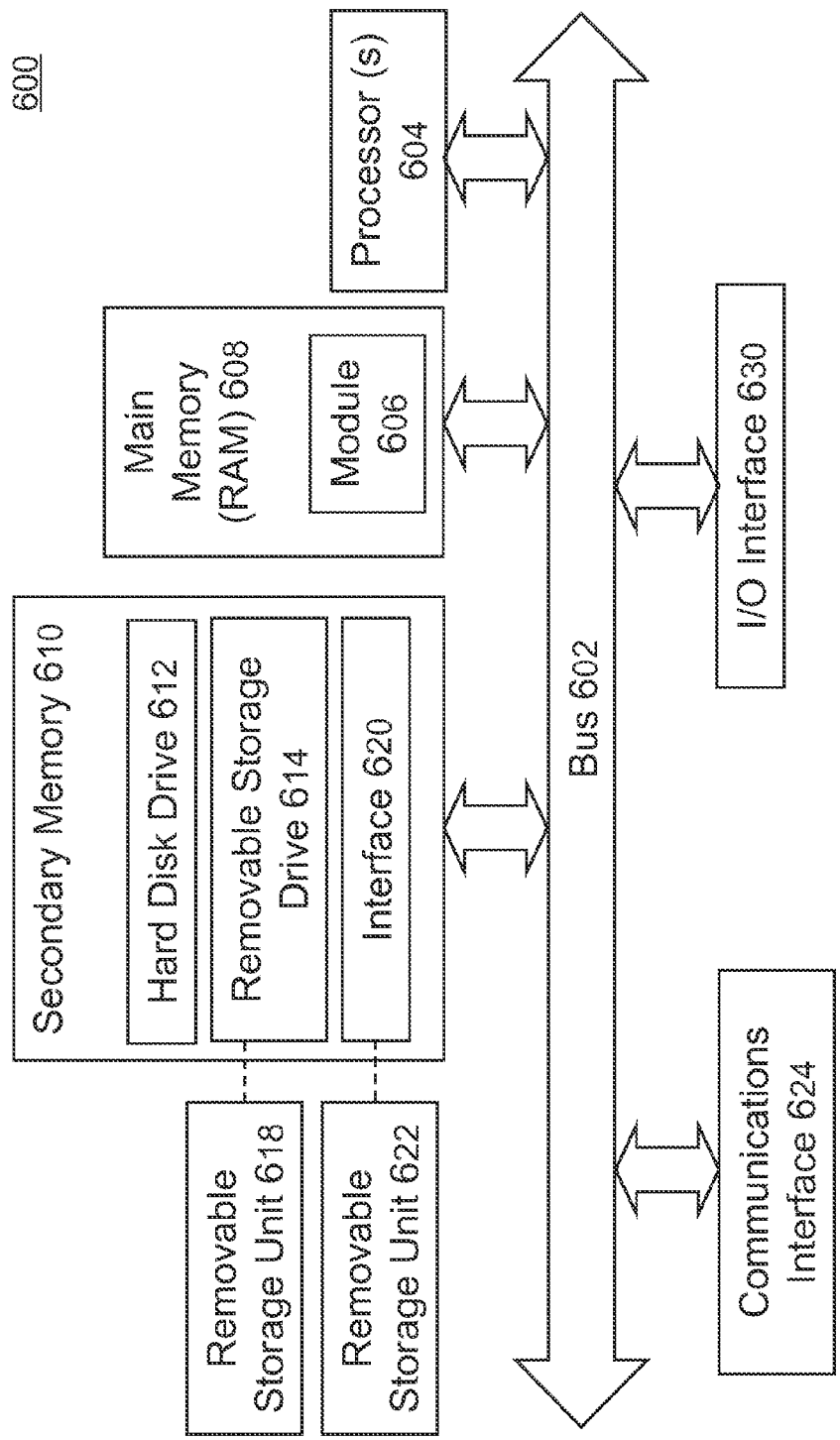
FIG. 6 is a function diagram showing salient components of a computing device, in which an embodiment of the present invention may be implemented.

According to one aspect, the present invention is directed towards one or more computer systems capable of carrying out the functionality described herein. An example of a computer system 600 is shown in FIG. 6. The computer system 600 includes one or more processors, such as processor 604. The processor 604 is connected to a computer system internal communication bus 602. Various software embodiments are described in terms of this exemplary computer system. After reading this description, it will become apparent to a person skilled in the relevant art(s) how to implement the invention using other computer systems and/or computer architectures.

Computer system 600 also includes a main memory 608, preferably random access memory (RAM), and may also include a secondary memory 610. The secondary memory 610 may include, for example, one or more hard disk drives 612 and/or one or more removable storage drives 614, representing a floppy disk drive, a magnetic tape drive, an optical disk drive, etc. The removable storage drive 614 reads from and/or writes to a removable storage unit 618 in a well-known manner. Removable storage unit 618, represents a floppy disk, magnetic tape, optical disk, etc. which is read by and written to by removable storage drive 614. As will be appreciated, the removable storage unit 618 includes a computer readable medium having stored therein computer software and/or data.

In alternative embodiments, secondary memory 610 may include other similar means for allowing computer programs or other instructions to be loaded into computer system 600. Such means may include, for example, a removable storage unit 622 and an interface 620. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 622 and interfaces 620 which allow software and data to be transferred from the removable storage unit 622 to computer system 600. In general, Computer system 600 is controlled and coordinated by operating system (OS) software, which performs tasks such as process scheduling, memory management, networking and I/O services.

There may also be a communications interface 624 connecting to the bus 602. Communications interface 624 allows software and data to be transferred between computer system 600 and external devices. Examples of communications interface 624 may include a modem, a network interface (such as an Ethernet card), a communications port, a Personal Computer Memory Card International Association (PCMCIA) slot and card, etc.

The computer 600 communicates with other computing devices over a data network based on a special set of rules (i.e., a protocol). One of the common protocols is TCP/IP (Transmission Control Protocol/Internet Protocol) commonly used in the Internet. In general, the communication interface 624 manages the assembling of a data file into smaller packets that are transmitted over the data network or reassembles received packets into the original data file. In addition, the communication interface 624 handles the address part of each packet so that it gets to the right destination or intercepts packets destined for the computer 600.

In this document, the terms "computer recordable storage medium", "computer recordable medium" and "computer readable medium" are used to generally refer to media such as removable storage drive 614, and/or a hard disk installed in hard disk drive 612. These computer program products are means for providing software to computer system 600. The invention is directed to such computer program products.

The computer system 600 may also include an input/output (I/O) interface 630, which provides the computer system 600 to access monitor, keyboard, mouse, printer, scanner, plotter, and alike.

Computer programs (also called computer control logic) are stored as application modules 606 in main memory 608 and/or secondary memory 610. Computer programs may also be received via communications interface 624. Such computer programs, when executed, enable the computer system 600 to perform the features of the present invention as discussed herein. In particular, the computer programs, when executed, enable the processor 604 to perform features of the present invention. Accordingly, such computer programs represent controllers of the computer system 600.

In an embodiment where the invention is implemented using software, the software may be stored in a computer program product and loaded into computer system 600 using removable storage drive 614, hard drive 612, or communications interface 624. The application module 606, when executed by the processor 604, causes the processor 604 to perform the functions of the invention as described herein.

The main memory 608 may be loaded with one or more application modules 606 that can be executed by one or more processors 604 with or without a user input through the I/O interface 630 to achieve desired tasks. In operation, when at least one processor 604 executes one of the application modules 606, the results are computed and stored in the secondary memory 610 (i.e., hard disk drive 612). The status of the time-marching engineering simulation (e.g., deformed beam element, deformed surface, and their relative position, etc.) is reported to the user via the I/O interface 630 either in a text or in a graphical representation.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the global searching schemes are described and shown using bucket sorting algorithm, other equivalent techniques can be used to accomplish the same. Additionally, whereas the surface mesh has been shown to be a finite element mesh with a circular shape, other types of surface mesh can be used. Furthermore, the surface mesh has been shown in a two-dimensional for illustration simplicity, the surface mesh can be a surface of an arbitrary shaped three-dimensional object. In summary, the scope of the invention should not be restricted to the specific exemplary embodiments disclosed herein, and all modifications that are readily suggested to those of ordinary skill in the art should be included within the spirit and purview of this application and scope of the appended claims.

I claim:

1. A method of simulating a beam element in contact with a surface mesh in finite element analysis comprising:

receiving, in a computer system, a finite element analysis model having at least one beam element and at least one surface mesh, to represent one or more objects to be contacted with each other, wherein each of the at least one beam element having first and second end nodes, and the at least one surface mesh contains a plurality of two-dimensional finite elements;

establishing a minimum characteristic length (CL) of the at least one surface mesh;

creating one or more interior points between the first and second end nodes of said each of the at least one beam element in accordance with a formula as a function of the minimum CL, when said each of the at least one beam element's length is longer than the minimum CL;

calculating a set of contact resisting forces at each nodal point along said each of the at least one beam element, said each nodal point is one of said first and second end nodes and said one or more interior points, wherein each of the set of contact resisting forces includes a compensational force counterbalancing an initial interpenetration distance with the at least one surface mesh at said each nodal point; and conducting a time-marching engineering simulation in the computer system using the finite element model using a finite element analysis including contact effects via an intermittent global search in conjunction with a local search to determine which one of said first and second end nodes and said one or more interior points is in contact with each of the plurality of two-dimensional finite elements, the time-marching engineering simulation's results are presented to a user via an output interface coupled to the computer system such that the user can use the results to make decision in improvement of an engineering product design, wherein the time-marching engineering simulation contains a plurality of solution cycles.

2. The method of claim 1, wherein a characteristic length is a smallest distance across said each of the two-dimensional finite elements.

3. The method of claim 1, wherein said one or more interior points divides the beam element into a plurality of segments, each segment having a length less than or equal to the minimum CL.

4. The method of claim 1, wherein the initial interpenetration distance is assigned to a positive value when said each node is found to be located within one of the at least one surface mesh, otherwise the initial interpenetration is assigned to zero.

5. The method of claim 4, wherein the compensational force remains at zero as corresponding interpenetration distance decreases from the initial interpenetration distance.

6. The method of claim 5, wherein the compensational force is a function of the interpenetration distance and an assigned nodal stiffness at said each node.

7. The method of claim 6, wherein the nodal stiffness is a function of nodal mass when the finite element analysis is conducted with an explicit solution scheme.

8. The method of claim 1, further comprises defines a parametric coordinate for said each node along said each of the at least one beam element.

9. The method of claim 1, further comprises assigning a thickness at said each node along said each of the at least one beam element for checking contact between outer skin of the beam element and the surface mesh.

10. The method of claim 1, wherein said each of the at least one surface mesh contains the two-dimensional finite elements with arbitrary non-uniform density.

11. The method of claim 1, wherein the intermittent global search is configured for detecting a contact between the at least one beam element and disjointed segments contained on the at least one surface mesh.

12. The method of claim 1, said conducting the time-marching engineering simulation in the computer system using the finite element model using the finite element analysis including contact effects via the intermittent global search in conjunction with the local search further comprises making an estimate for a next contact between said each nodal point and said at least one surface mesh based on current conditions of the time-marching engineering simulation, wherein the next contact is predicted to occur in $N_{est}$ solution cycles.

13. The method of claim 12, wherein the local search for said each nodal point is configured to be skipped for subsequent one half of the $N_{est}$ solution cycles immediately after each said estimate has been made.

14. A system for simulating a beam element in contact with a surface mesh in finite element analysis comprising:
    a main memory for storing computer readable code for an application module;
    at least one processor coupled to the main memory, said at least one processor executing the computer readable code in the main memory to cause the application module to perform operations by a method of:
    receiving, in the system, a finite element analysis model having at least one beam element and at least one surface mesh, to represent one or more objects to be contacted with each other, wherein each of the at least one beam element having first and second end nodes, and the at least one surface mesh contains a plurality of two-dimensional finite elements;
    establishing a minimum characteristic length (CL) of the at least one surface mesh;
    creating one or more interior points between the first and second end nodes of said each of the at least one beam element in accordance with a formula as a function of the minimum CL, when said each of the at least one beam element's length is longer than the minimum CL;
    calculating a set of contact resisting forces at each nodal point along said each of the at least one beam element, said each nodal point is one of said first and second end nodes and said one or more interior points, wherein each of the set of contact resisting forces includes a compensational force counterbalancing an initial interpenetration distance with the at least one surface mesh at said each nodal point; and
    conducting a time-marching engineering simulation in the system using the finite element model using a finite element analysis including contact effects via an intermittent global search in conjunction with a local search to determine which one of said first and second end nodes and said one or more interior points is in contact with each of the plurality of two-dimensional finite elements, the time-marching engineering simulation's results are presented to a user via an output interface coupled to the system such that the user can use the results to make decision in improvement of an engineering product design, wherein the time-marching engineering simulation contains a plurality of solution cycles.

15. A computer readable medium containing instructions for controlling a computer system for simulating a beam element in contact with a surface mesh in finite element analysis by a method comprising:
    receiving, in the computer system, a finite element analysis model having at least one beam element and at least one surface mesh, to represent one or more objects to be contacted with each other, wherein each of the at least one beam element having first and second end nodes, and the at least one surface mesh contains a plurality of two-dimensional finite elements;
    establishing a minimum characteristic length (CL) of the at least one surface mesh;
    creating one or more interior points between the first and second end nodes of said each of the at least one beam element in accordance with a formula as a function of the minimum CL, when said each of the at least one beam element's length is longer than the minimum CL;
    calculating a set of contact resisting forces at each nodal point along said each of the at least one beam element, said each nodal point is one of said first and second end nodes and said one or more interior points, wherein each of the set of contact resisting forces includes a compensational force counterbalancing an initial interpenetration distance with the at least one surface mesh at said each nodal point; and
    conducting a time-marching engineering simulation in the computer system using the finite element model using a finite element analysis including contact effects via an intermittent global search in conjunction with a local search to determine which one of said first and second end nodes and said one or more interior points is in contact with each of the plurality of two-dimensional finite elements, the time-marching engineering simulation's results are presented to a user via an output interface coupled to the computer system such that the user can use the results to make decision in improvement of an engineering product design, wherein the time-marching engineering simulation contains a plurality of solution cycles.

* * * * *